United States Patent [19]

Murofushi

[11] Patent Number: 5,191,542

[45] Date of Patent: Mar. 2, 1993

[54] AUTOMATIC FLOORPLAN OPERATION APPARATUS

[75] Inventor: Masako Murofushi, Kanagawa, Japan

[73] Assignee: Kabushiki Kaisha Toshiba, Kawasaki, Japan

[21] Appl. No.: 523,525

[22] Filed: May 15, 1990

[30] Foreign Application Priority Data

Jun. 23, 1989 [JP] Japan .................................. 1-159771

[51] Int. Cl.[5] .............................................. G06F 15/60
[52] U.S. Cl. .................................... 364/491; 364/490; 364/489; 364/488
[58] Field of Search ................ 364/488, 489, 490, 491

[56] References Cited

U.S. PATENT DOCUMENTS

| T940,008 | 11/1975 | Oden et al. | 364/490 |
|---|---|---|---|
| 4,500,963 | 2/1985 | Smith et al. | 364/491 |
| 4,577,276 | 3/1986 | Dunlop et al. | 364/491 |
| 4,754,408 | 6/1988 | Carpenter et al. | 364/491 |
| 4,815,003 | 3/1989 | Putatunda et al. | 364/491 |
| 4,835,705 | 5/1989 | Fujino et al. | 364/491 |
| 4,918,614 | 4/1990 | Modarres et al. | 364/490 |

OTHER PUBLICATIONS

N. Quinn, Jr. et al, "A Forced Directed Component Placement Procedure for Printed Circuit Boards", IEEE Transactions on Circuits and Systems, vol. CAS-26, No. 6, Jun., 1979, pp. 377–388.

K. Nomura, et al, "An Efficient Block Placement Method for VLSI Design with Aspect-Ratio Modification Process", Dept. of Electrical and Electronic Engineering, Tokyo Institute of Tech., CAS87-236, pp. 13–18.

H. Onodera, et al, "A Block Placement Procedure Using a Force Model", Kyoto University, CAS-86-194, pp. 47–54.

*Primary Examiner*—Vincent N. Trans
*Attorney, Agent, or Firm*—Foley & Lardner

[57] ABSTRACT

Disclosed is an automatic floorplan operation apparatus for automatically performing a layout of cells onto a plurality of arrangeable areas which are optionally permitted to be overlapped on a chip. This apparatus evaluates degrees of cell densities in the respective arrangeable areas based on cell distributions therein by an objective function. When the evaluation is insufficient, an area definition correction unit also provided in the apparatus corrects the cell densities in accordance with FDM so that the cell densities in the overlapped and the independent areas are made uniform. This correction is carried out by a shift routine and a transformation routine, and is automatically repeated until the most suitable floorplan can be obtained.

6 Claims, 12 Drawing Sheets

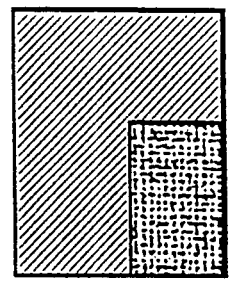
FIG.4B
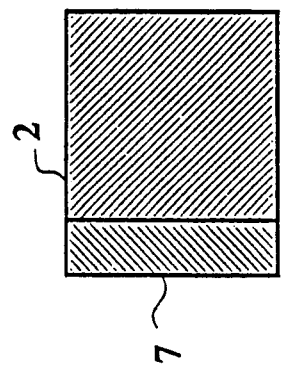
FIG.4A
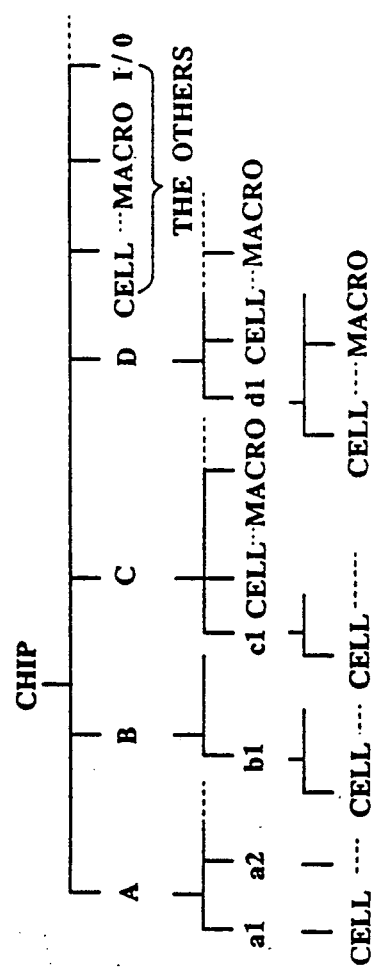
FIG.3A
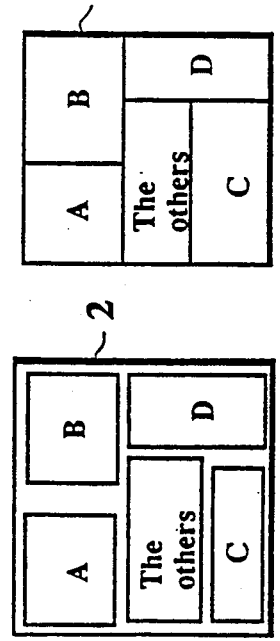
FIG.3D
FIG.3C
FIG.3B

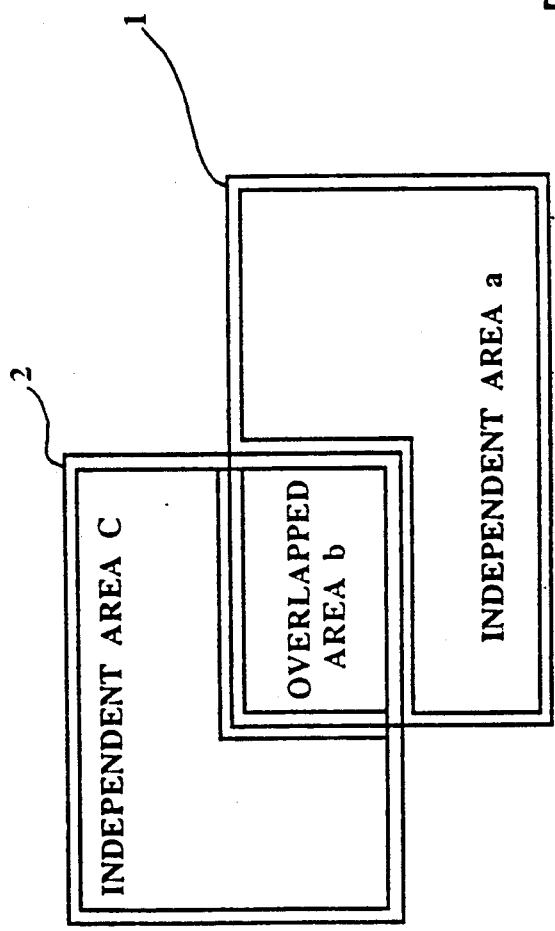

FIG.12BC

| | AREA | CELL AREA IN AREA 1 | CELL AREA IN AREA 2 | CELL DENSITY |
|---|---|---|---|---|
| a | 15 | 6.5 | 0 | 0.43 |
| b | 10 | 3.5 | 0.8 | 0.43 |
| c | 5 | 0 | 2.2 | 0.43 |

FIG.12BB

| | AREA | CELL AREA |
|---|---|---|
| 1 | 25 | 10 |
| 2 | 15 | 3 |

AUTOMATIC FLOORPLAN OPERATION APPARATUS

BACKGROUND OF THE INVENTION

1. Field of the Invention

The present invention relates to an automatic floorplan operation apparatus for design automation of a semiconductor integrated circuit such as a standard cell and a gate array and more particularly, to an automatic floorplan operation apparatus for performing a layout of cells in a plurality of arrangeable areas which are permitted to be overlapped.

2. Description of the Prior Art

A design procedure of a semiconductor integrated circuit (called LSI hereinafter) is ordinarily carried out as shown in FIG. 1. Namely, a system design is carried out in a step S1, then a logic design to compose an electronic circuit is prepared in a step S2. Subsequently, a layout design on an LSI chip based on the logic design step S2 is carried out in a step S3, further the layout design is verified in a step S4. Thereafter, a sample is prepared in a step S5.

A floorplan is made before an automatic placement and a wiring process in the layout design step S3. For example, the floorplan is prepared to obtain a suitable layout on a semiconductor chip, by which various circuit elements can be uniformly arranged. Moreover, the plan also is made for shortening wiring length to control delay of signals under severs timing conditions and for reducing the whole area of the chip.

FIG. 2 shows an example of a layout of an LSI. In the floorplan, an outline of the composition of a chip 2 is determined. Namely, the object of the floorplan is to determine how to wire a power source wire 1 to the respective cells 3 in the chip 2, what order input-output cells 4 are arranged on the periphery of the chip 2, where blocks 5, such as a RAM and a ROM, having relatively large areas and previously completely designed are to be arranged on the chip 2, and where collective cells respectively having specific functions are arranged.

Particularly, the result of the floorplan process concerning shape and layout region of the collective cells is very important because it has a great deal of influence on layout and wiring after the floorplan, the integration degree of elements in the chip, and efficiency in the use of the chip area and the design.

FIGS. 3A to 3D show examples of results of floorplans for an LSI in which respective elements are related in a logical hierarchy structure.

Reference characters A, B, C and "others", respectively designate modules in which the collective cells and macro blocks are divided. Namely, FIGS. 3A to 3D show several ways to separately arrange these modules A, B, C, D and others on the chip 2. For example, in the logical hierarchy structure shown in FIG. 3A, when only the module C has severe conditions on timing, a floorplan is based particularly on the position and the shape of the module C, while the result of a floorplan based on the building block method becomes as shown in FIG. 3B, and that based on the slicing structure method becomes as shown in FIG. 3C.

However, in the case of the building block method, an unavailable area 6 (wiring area among blocks) where cells can not be arranged is made around the modules or blocks A, B, C, D, and others. When an unavailable area 6 is defined in advance, the flexibility of automatic placement and wiring after the floorplan is restricted, so that the placement and wiring can not be carried out effectively.

In the case of the slicing structure method, the unavailable area is not made around the blocks A, B, C, D and others. However, since overlaps between these blocks are not permitted, an extremely long longitudinal or transverse area 7 as shown in FIG. 4A is likely to be required. When an arrangeable area is extremely long and thin, the automatic placement and wiring can not be carried out effectively. Thus, the block area must be enlarged more than necessary.

To solve the problems, it is possible to use a method in which arrangeable areas are permitted to be overlapped as shown in FIGS. 3D and 4B. As compared to the former two methods in which all the collective cells are assigned to each area even if there is no necessity for constraints such as timing constraints, the shapes and the positions of the respective collective cells can be optionally decided by the latter method where the arrangeable areas are permitted to be overlapped. Thus, automatic layout and wiring are not restricted so severely as in the former methods, thereby expecting a higher density layout. For a layout designer, the working amount can be reduced by flexibility of design owing to the method in which arrangeable areas are permitted to be overlapped by optionally determining the shape and the position of the areas.

For example, in the case of the building block method shown in FIG. 3B, the wiring area must be considered to decide the positions of the respective blocks A, B, C, D and others. While, in the case of the slicing structure method shown in FIG. 3C, the positioning for the modules A, B, D, and others other than the module C which is not particularly required must be decided. Therefore, the flexibility of design is restricted. While, in the case of the method shown in FIG. 3D, where the arrangeable areas are permitted to be overlapped, only the required positioning of the module C can be preferentially decided, then the automatic layout of the modules can be decided suitably and flexibly.

Moreover, as compared to the methods where the shapes and positions of these modules are decided without overlaps of the arrangeable areas, it is possible for the designer to approximately decide them. For example, in the layouts of the floorplan shown in FIGS. 3B and 3C, the designer must evaluate the shapes and the positions of the respective modules relatively correctively in advance to reduce the unavailable area. Therefore, the flexibility of design is restricted. When rough evaluation can be acceptable in the case of method where the arrangeable areas are permitted to be overlapped, flexibility is increased.

FIG. 5 shows another example of a floorplan in which overlap is also permitted. In a chip 2 having the same logical-hierarchy structure as shown in FIG. 3A, cells α (other than cell groups of a1, a2 composed of collective cells in a module A) are with overlap assigned on arrangeable areas (herein, the whole area in the chip 2) of cells and macro blocks other than modules A, B in the chip 2. Moreover, arrangeable areas β for cells and macro blocks in the module B, α1 for cells in the cell module a1, and α2 for the cell module a2 in the module A are respectively so arranged as to be slightly overlapped with one another. When such a floorplan in which overlap permitted is used, the unavailable area as mentioned above is not fixed on the chip 2, further the shapes and the positions of the respective modules for the cells and blocks are not restricted. Thus, the floorplan should have a wide flexibility of design.

However, in the methods where the overlap is permitted, the overlap can not be permitted without limit. To utilize the chip area efficiently, it is necessary to eliminate non-uniformity of cell density in the chip in which a ratio is a ratio of the cell area to the area of the chip substrate, and to make a floorplan to realize a facile layout and wiring for the post-processes.

The reasons are as follows. In a portion where the cell density is high, the density of wiring becomes extremely high. As a result, unwired portions or wiring shorts between the wires are likely to be caused in the case of an LSI of the gate array type, or the chip area must be increased in an LSI of the standard-cell type. While, in a portion of lower cell density, of course, unused portions are generated in the placement and the wiring area. Namely, when the cell density is non-uniform, a portion of an excessively high density and another portion having unused area are present in the chip at the same time, thus the chip area is not effectively used. Therefore, it is important to make the cell density uniform in the floorplan in which the overlap of arrangeable areas is permitted.

Various methods to automate a floorplan based on the building block method and the slicing structure method have been conventionally proposed. Particularly in the method called the Force Directed Method (FDM; based on a dynamic technique) used in the building block method, a wiring length is defined by an evaluation value as a positional energy, and the optimization of the floorplan is carried out by minimizing the evaluation value by mutually shifting the respective arrangeable areas little by little (cf. reference literature 1, 2, and 3 hereinafter).

In the FDM, the algorithm is relatively easy, and a plan by a designer can be an initial value, further the designer can easily improve the arrangeable areas automatically designed. However, the inventors have not seen examples where the dynamic technique is applied to the automatic floorplan in which the overlap is permitted or to making cell density uniform.

As stated above, in the building block method and the slicing structure method used in the conventional floorplan, the flexibility of design for the arrangeable areas is relatively narrow. While, even in the conventional method in which the overlapped areas are permitted, making cell density uniform in a chip is not sufficiently realized.

REFERENCE LITERATURES (1) N. R. QUINN, Jr. and M. A. Breuer. June 1979. "A Forced Directed Component Placement Procedure for Printed Circuit Boards." IEEE Trans Circuits Syst., CAS26, No. 6, JUNE 1979.
(2) Hidetoshi Onodera, Toshihiko Kurihara and Keikichi Tamaru. 1986. "A BLOCK PLACEMENT PROCEDURE USING A FORCE MODEL." Shingaku Giho, CAS 86-194.
(3) Kiyoshi Nomura, Mineo Kaneko and Mahoki Onoda. 1987. "An Efficient Block Placement Method for VLSI Design with Aspect-Ratio Modification Process." Shingaku Giho, CAS 87-236.

SUMMARY OF THE INVENTION

The present invention has been made in the light of the above problems, therefore it is an object thereof to provide an automatic floorplan operation apparatus to automatically make cell density uniform in design of a floorplan in which overlapped areas are permitted.

To achieve the object, an automatic floorplan operation apparatus according to the present invention performs layout of a plurality of groups of cells respectively having related functions into arrangeable areas which are permitted on a chip. Moreover, the automatic floorplan operation apparatus according to the present invention is composed of an estimated distribution estimation unit for deciding estimated distribution of the groups of cells into overlapped areas and independent areas in a plurality of the arrangeable areas, a cell density operation unit for operating each cell density of the groups of cells to be estimably distributed into the overlapped areas and the independent areas, a cell density evaluation unit for evaluating the degree of uniformity of each cell density in the overlapped areas and the independent areas, which is obtained by the cell density operation unit, and an area definition correction unit for correcting the arrangeable areas by the Force Directed Method (FDM; based on a dynamic technique) when the uniformity of the cell density is evaluated to be insufficient by the cell density evaluation unit.

Moreover, the area definition correction unit sets new positional relations of the respective arrangeable areas by shifting them in a uniform direction minutely so as to make cell density uniform by the FDM based on the cell density evaluation result obtained from the cell density evaluation unit.

Furthermore, the area definition correction unit sets new arrangeable areas to uniform shapes minutely so as to make cell density uniform by the FDM based on the element evaluation result obtained from the cell density evaluation unit.

Additionally, the area definition correction unit can repeat an area definition correction operation for setting new positional relations of the respective arrangeable areas by shifting them minutely so as to make the cell density uniform by the FDM based on the cell density evaluation result obtained from the cell density evaluation unit, and another area definition correction operation for setting new arrangeable areas by transforming the original arrangeable areas so as to make the cell density uniform by the FDM based on the element evaluation result obtained from the cell density evaluation unit.

In the automatic floorplan operation apparatus of the present invention as mentioned above, the cell densities of the overlapped areas and the independent areas in the arrangeable areas for which the layout of a plurality of the groups of cells is provided are respectively operated by the cell density operation unit.

From the operation result obtained by the cell density operation unit, the degree of uniformity of the cell densities in the overlapped areas and the independent areas are respectively evaluated. Then, when the uniformity is judged to be insufficient, the positions and shapes of the arrangeable areas are corrected by the area definition correction unit so as to make the cell densities uniform. The cell density operation for the respective areas by the cell density operation unit, the uniformity evaluation of the cell densities by the cell density evaluation unit, and the correction of the shapes and the positions of the arrangeable areas are repeated until the cell densities of the overlapped areas and the independent areas are uniformized made uniform.

Thus, according to the present invention, a floorplan which includes overlapped layout areas and has a uniform cell density over the respective layout areas of cells on a chip can be automatically designed.

These and other objects, features and advantages of the present invention will be more apparent from the following description of a preferred embodiment, taken in conjunction with the accompanying drawings.

BRIEF DESCRIPTION OF THE DRAWINGS

FIG. 3A is a logical hierarchy diagram of elements used an ordinary floorplan,

FIG. 3B is a diagram of a floorplan where an ordinary building block method is used, FIG. 3C is a diagram of a floorplan where an ordinary slicing structure method is used, FIG. 3D is a diagram of a floorplan where an ordinary method including overlapped areas is used, FIG. 4A is a layout obtained by a floorplan where overlap is not permitted, FIG. 4B is a layout obtained by a floorplan where overlap is permitted.

DETAILED DESCRIPTION OF THE INVENTION

Hereinafter embodiments of the present invention will be described with reference to the drawings.

Figure 2:
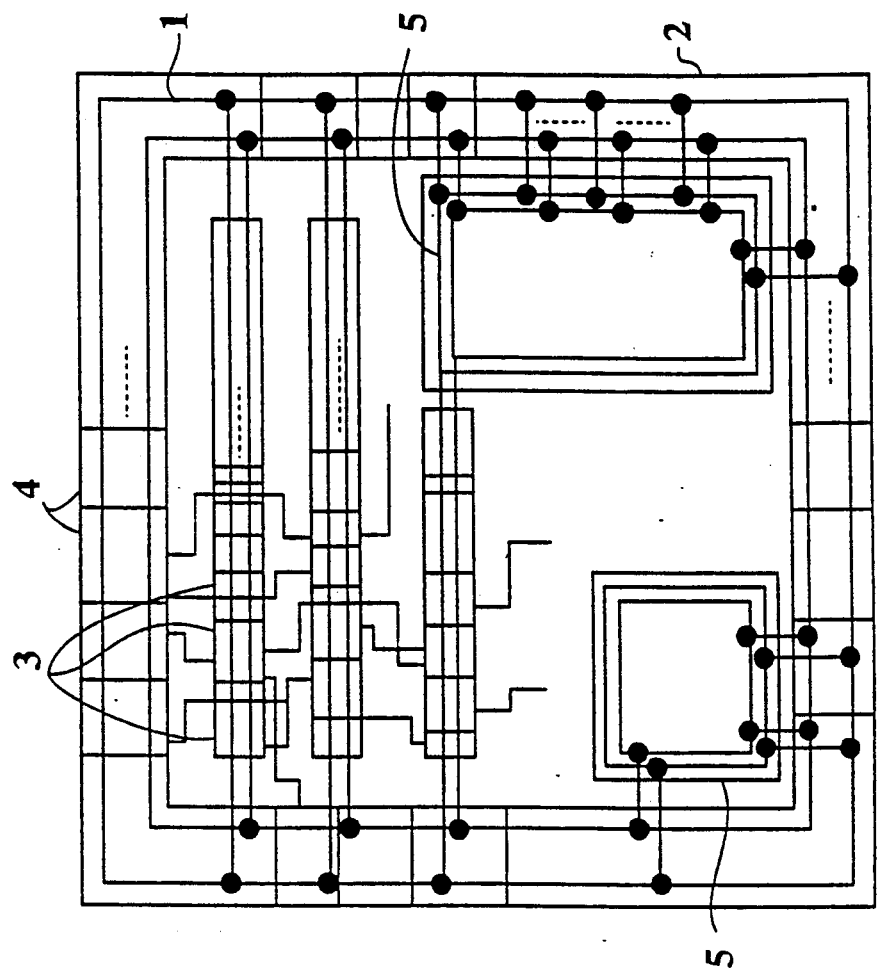
FIG. 2 is a layout of an ordinary LSI.
Figure 1:
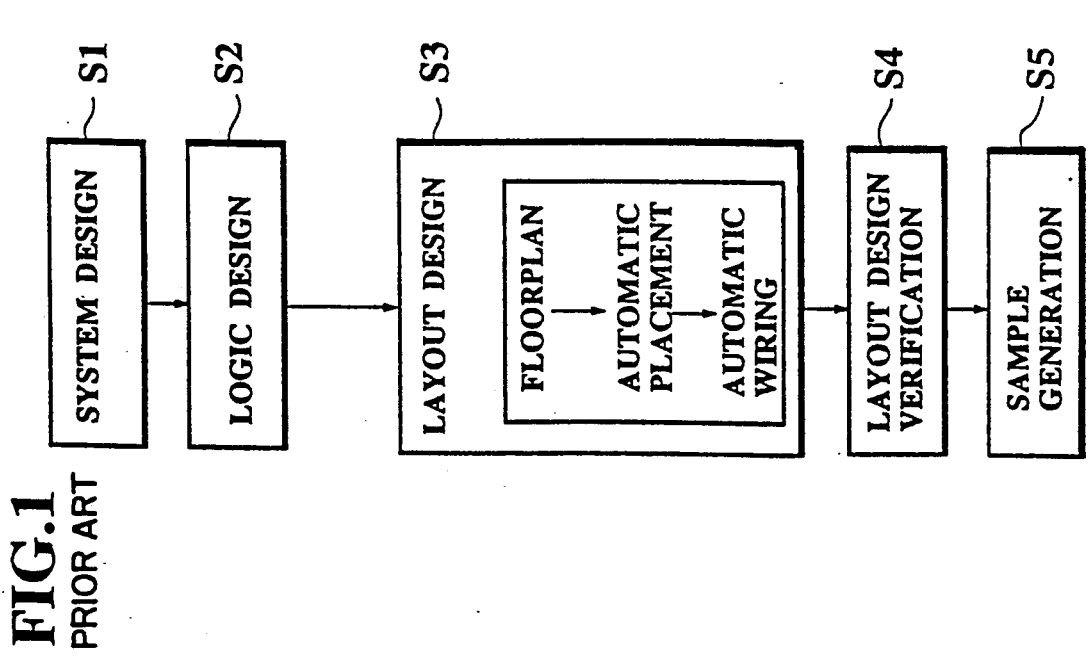
FIG. 1 is a flow chart to show design steps of an ordinary LSI.
Figure 5A:
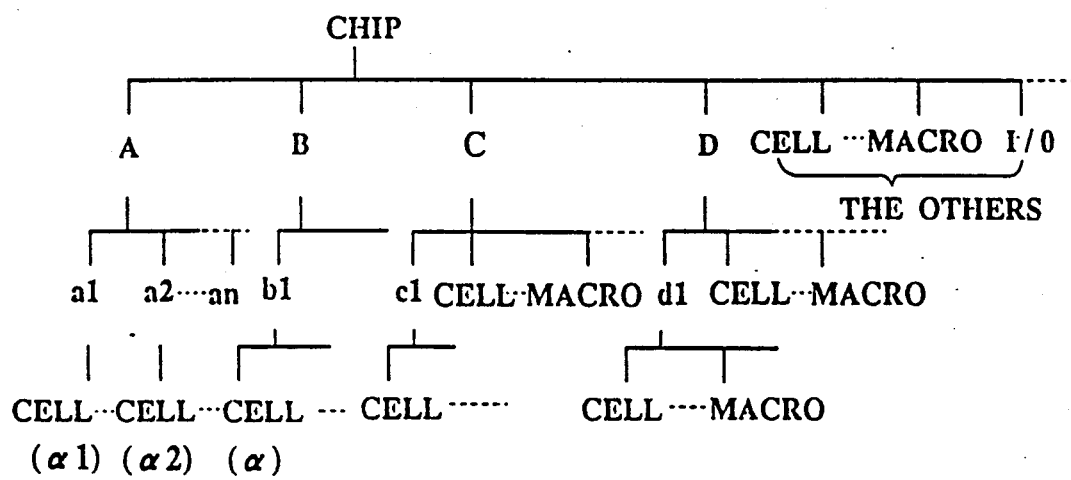
FIGS. 5A and 5B are diagrams to explain a floorplan where overlap is permitted.
Figure 5B:
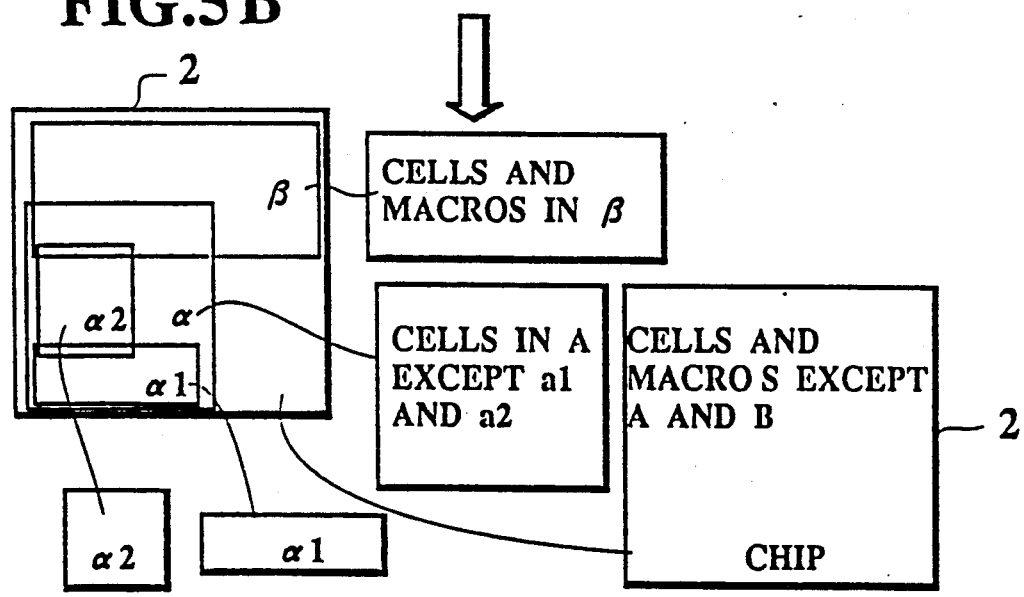
Figure 6:
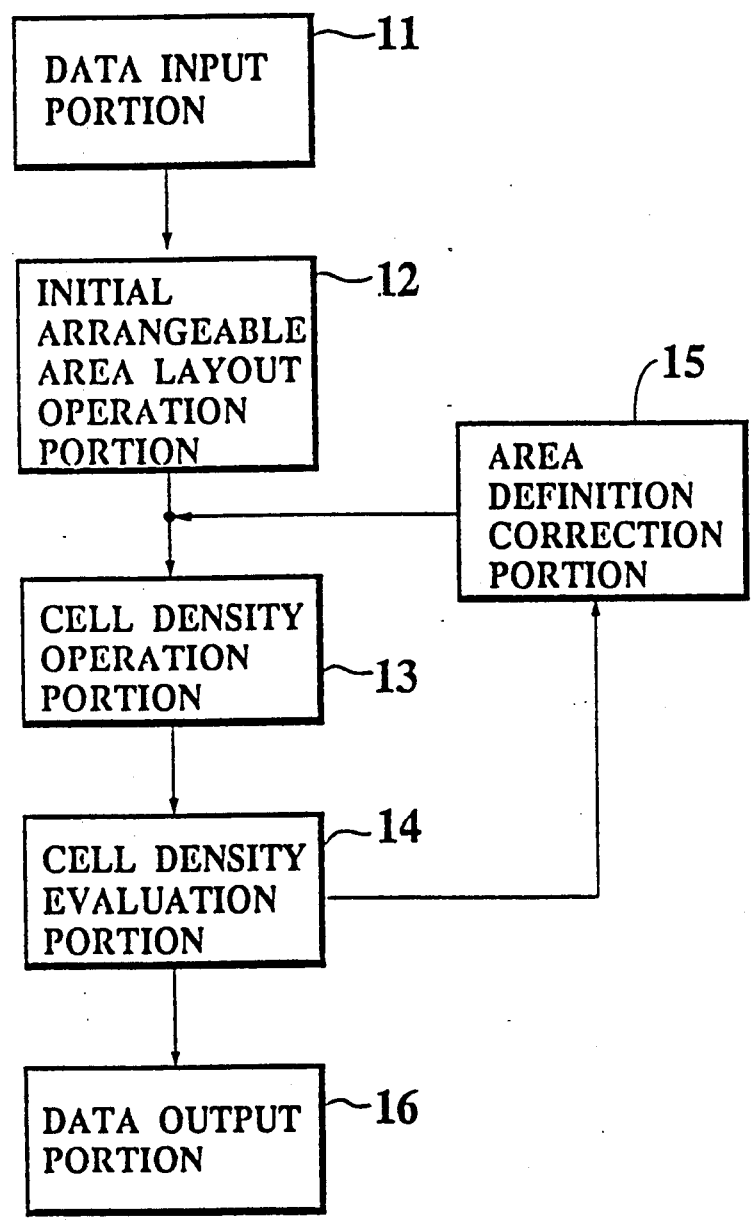
FIG. 6 is a compositional diagram of an automatic floorplan apparatus which is an embodiment of the present invention.

FIG. 6 is a block diagram of a floorplan operation apparatus which is an embodiment of the present invention. The apparatus is composed of a data input portion 11 for inputting necessary data such as data having a logical hierarchy structure as shown in FIG. 3A, and area of a chip, areas of cells and areas of macro blocks, and data showing shapes and sizes of other circuit elements, an initial layout operation to set portion 12 for operating an initial layout or a corrected layout of arrangeable areas, a cell density operation portion 13 for calculating an estimated distribution of cells in overlapped areas and independent areas of the arrangeable areas, then operating to set the cell density from the estimated distribution, a cell density evaluation portion 14 for evaluating uniformity of cell density in the respective areas obtained by the cell density operation portion 13, and an area definition correction portion 15 for correcting the uniformity of the initial layout when the uniformity of the cell densities is estimated to be insufficient by the cell density evaluation portion 14. Namely, the area definition correction portion 15 operationally corrects the estimated layout by shifting positions of arrangeable areas minutely, or transforming the shapes of the arrangeable areas a little, or shifting and transforming them minutely when the uniformity of the cell densities is insufficient. Additionally, a data output portion 16 for outputting layout relation data in the arrangeable areas when the uniformity of the cell density is estimated to be sufficiently by the cell density evaluation portion 14 is included in the apparatus.

Next, operation of the automatic floorplan operation apparatus mentioned above will be described.

Figure 7:
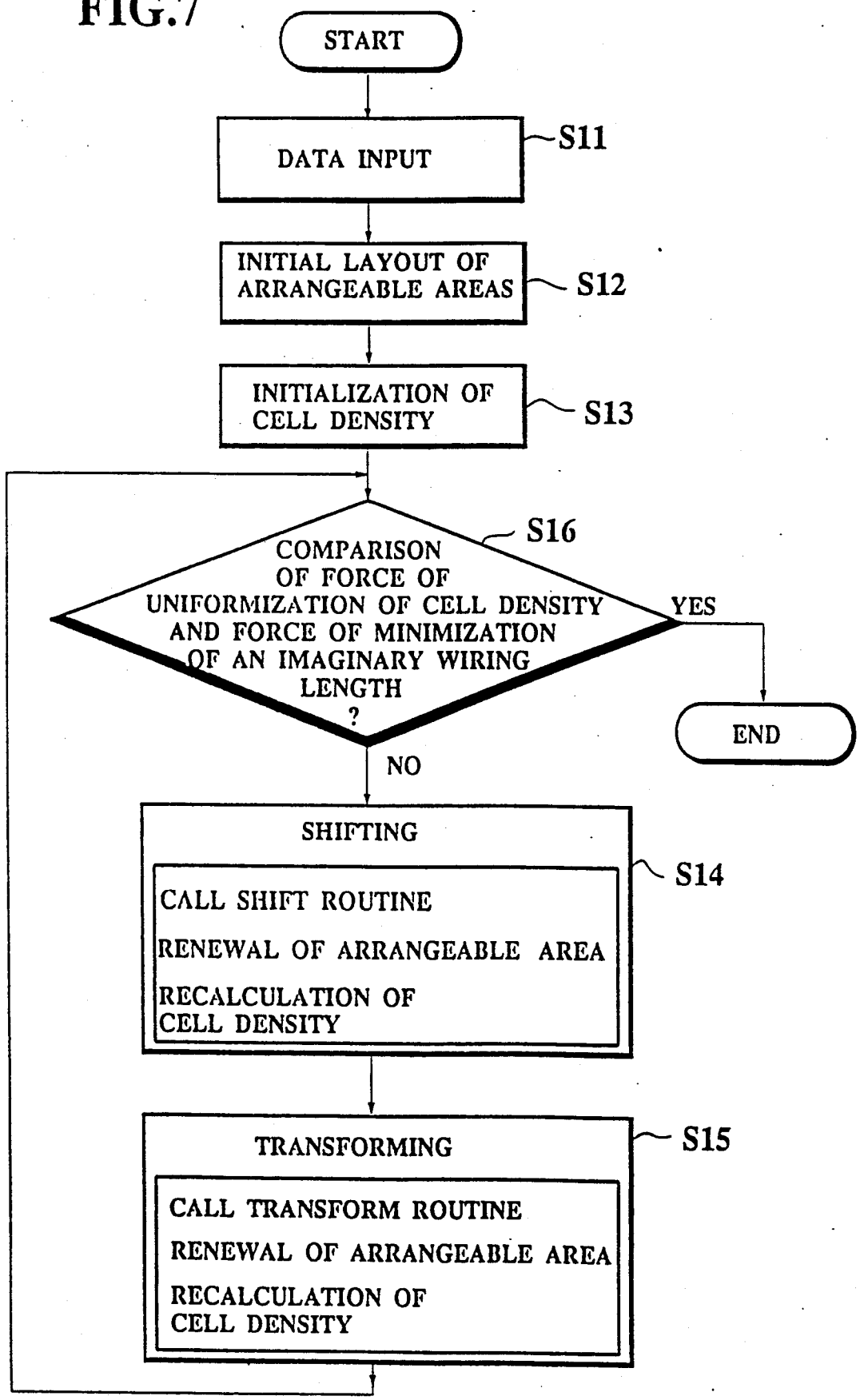
FIG. 7 is a flow chart to show operation of the automatic floorplan apparatus of the embodiment shown in FIG. 6.

FIG. 7 is a flow chart of the operation of the automatic floorplan operation apparatus of the embodiment shown in FIG. 6. In this drawing, an automatic floorplan operation for evaluating minimization of the estimated wiring length and uniformity of the cell density at the same time is shown.

First, necessary data concerning an area of a chip, a logical hierarchy structure and the total sum of areas of cells arranged in the arrangeable areas are inputted from the data input portion 11 (Step S11).

Next, an initial layout of the arrangeable areas is set by the estimated layout operation portion 12 (Step S12). In the step, an initial plan is inputted by a designer. When the initial plan is not prepared, the arrangeable areas are arranged at random on the chip. Layout of arrangeable areas for respective groups of cells to be related and arranged near to one another is carried out, and overlapped areas and independent areas of the arrangeable areas are obtained in this step.

Then, at the cell density operation portion 13, initialization of the cell distribution is carried out by arranging the groups of cells in the respective arrangeable areas, and cell density for the respective arrangeable areas are calculated (Step S13).

Subsequently, uniformity of the initial cell distribution is evaluation by the cell density evaluated portion 14 (Step S16).

Figure 10:
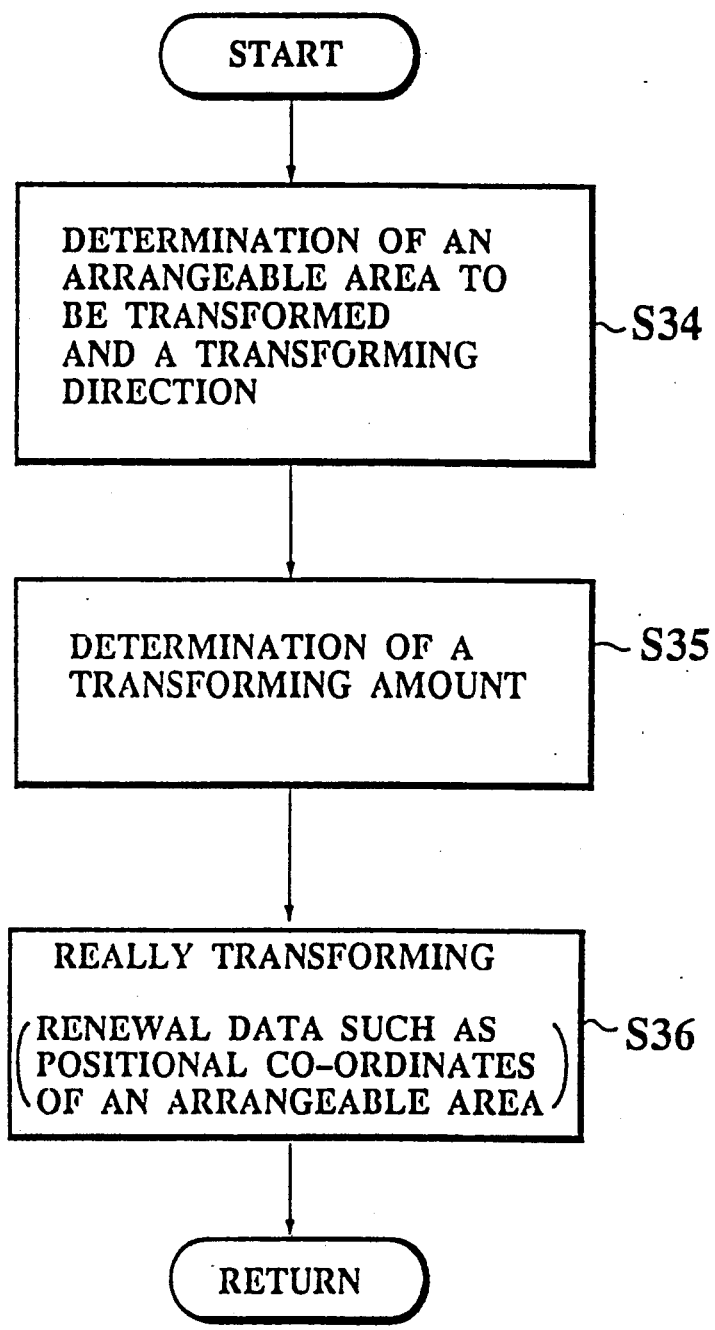
FIG. 10 is a flow chart to show operation of a process for transforming arrangeable areas based on FDM (based on a dynamic technique)

When the uniformity is evaluated to be insufficient, the arrangeable areas are shifted minutely based on a flow chart of a shift routine shown in FIG. 10 at the area definition correction portion 15, and then the area size of the overlapped areas and the independent areas are renewed.

Thereafter, the cell densities are recalculated (Step S14).

Moreover, when the uniformity is estimated to be insufficient, the arrangeable areas are transformed minutely based on a diagram as shown in FIG. 11 at the area definition correction portion 15, and then the area sizes of the overlapped areas and the independent areas are renewed.

Thereafter, the cell densities are recalculated (Step S15).

Figure 9:
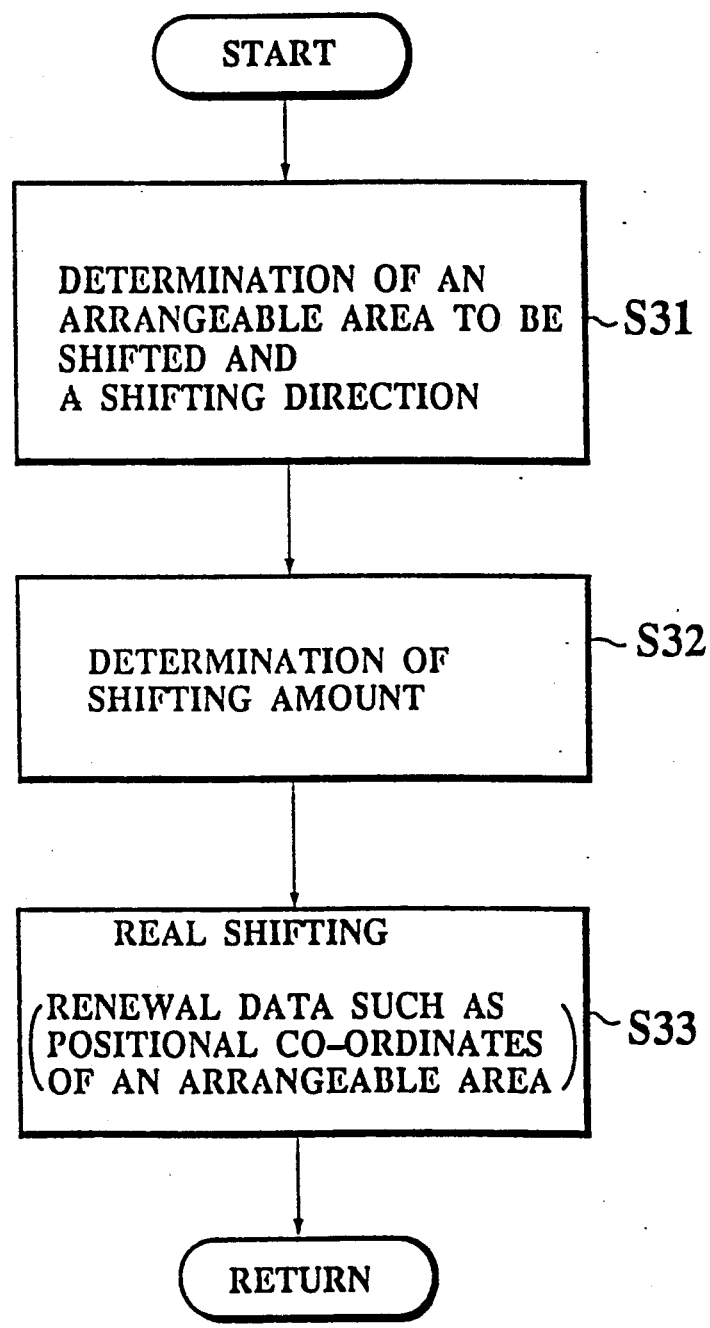
FIG. 9 is a flow chart to show operation of a process for shifting arrangeable areas based on FDM (based on a dynamic technique)

The calculations of the cell density by the cell density operation portion 13 in the steps S13, S14, and S15 are carried out based on a flow chart shown in FIG. 9.

After the shifting and the transforming process, evaluation of the uniformity of the cell densities and evaluation of the minimization of the estimated wiring length are carried out. As a result, when the cell densities are sufficiently uniform and the estimated wiring length is sufficiently shortened, the floorplan operation is ended.

While, when the result is insufficient, the process is returned to the step S14, then the uniformity of the cell density and the minimization of the estimated wiring length are carried out again by the shifting and the transforming process until the result becomes sufficient (Step S16).

Hereinafter, respective portions in the basic operation of the automatic floorplan of the embodiment will be explained in detail.

First, variables used for operations in the operational process, the shifting process and the transforming process in the steps S14 and S15 are defined as follows.

n: Index for expressing the arrangeable areas.
p: Index for expressing the overlapped areas and the independent areas.

Figure 11A:
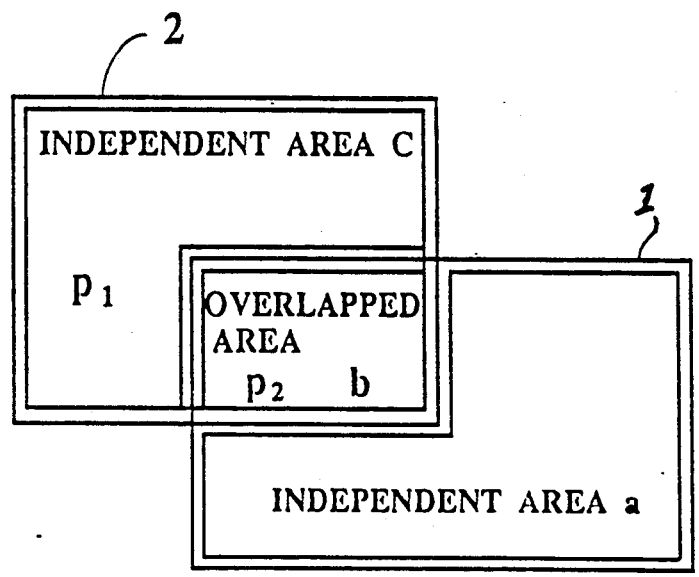
FIGS. 11A and 11B are explanatory diagrams to respectively show the overlapped areas and the independent areas, FIGS. 12A, 12BB, 12BC, 12C and 12D are diagrams to respectively show calculation results of evaluation values on the estimated distributions of cells, the cell density, and the uniformization of the cell density.

Incidentally, in the embodiment, p is used for an index to show an area in which the overlapped area p1 and the independent area p2 are not distinguished as shown in FIG. 11A. Moreover, in FIG. 11A, the cells in independent areas a and c respectively belong to only arrangeable areas 1 and 2.

However, the cells in the overlapped area b may belong to the arrangeable areas 1 or 2.

Figure 11B:
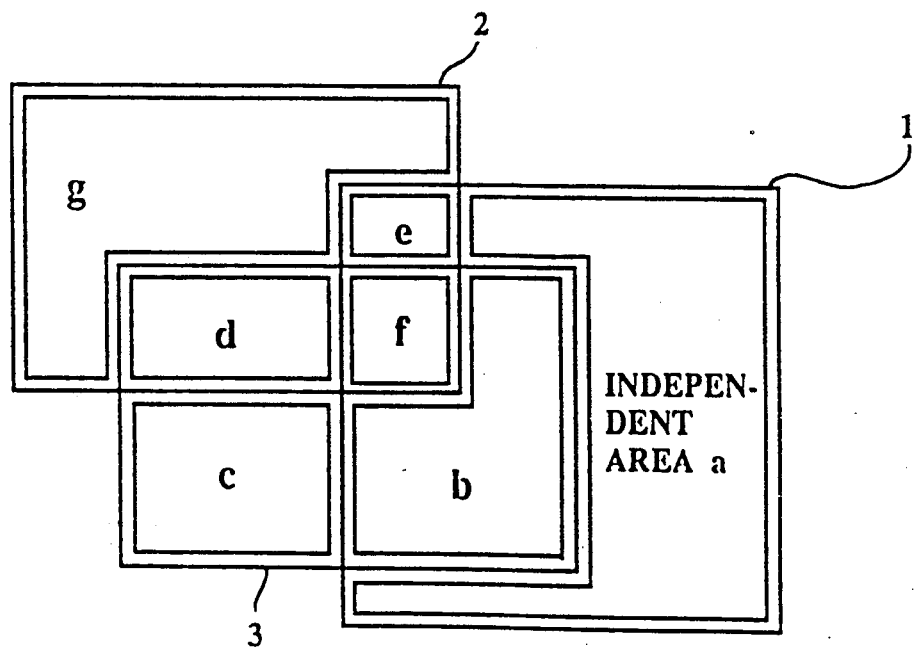

Similarly, in FIG. 11B, the cells in independent areas a, c and g respectively belong to only arrangeable areas 1, 2, and 3, while the cells in the overlapped areas b, d and e respectively may belong to the arrangeable areas 1 or 3, 2 or 3, 1 or 2. Moreover the cells in twice overlapped area f may belong to the arrangeable areas 1, 2, or 3. Moreover, several variables are defined as follows.

$c_n$: The total sum of cell areas to be assigned to the arrangeable area n.
$a_p$: Area of the overlapped or independent area p.
$a_n$: Area of the arrangeable area n.

Of course, the area $a_n$ is the same as the total sum of the overlapped areas and the independent areas.

$f_{np}$: Area of cells in the overlapped or independent area p which belong to the arrangeable area n.

Namely, a variable shows an estimated distribution of the cells, and is ordinarily a value of 0 or more ($f_{np} \geq 0$). In this case, the total sum of the area of the cells assigned to the arrangeable area n is the same as the total sum of the estimated cell distributions respectively corresponding to the overlapped areas or the independent areas which compose n together.

$u_p$: cell density in the overlapped or independent area p.

This variable shows a value obtained by division of the sum of the cell areas supplied to the overlapped or independent area p by the area of the overlapped or independent area p. Moreover, the variable is expressed by the following equation:

$$u_p = \sum_{n \in N} f_{np}/a_p,$$

where N is a set of the arrangeable areas.

Next, there is an objective function for making the cell density, which is used in the cell density uniform evaluation portion 14 (Step S16) of the embodiment.

When the total sums of the arrangeable areas and the cell areas respectively assigned to the arrangeable areas are given, the objective function for the uniformity of the cell density is expressed as follows:

$$\sum_K (\text{Area of each the independent or overlapped area}) \times (\text{cell density in the arrangeable area} - \text{the average cell density in the chip})^2,$$

where K means the total number of the overlapped areas and the independent areas.

Then, the arrangeable areas are shifted and transformed so as to make an objective value obtained from the evaluation function small. Accordingly, when the evaluation value is small, the cell densities are uniform enough, further each value becomes near the average value thereof in the respective arrangeable areas.

Since the terms related to the average cell density in the chip can be neglected in the expansion of the above formula, the above formula can be substantially equally changed to the following formula as an objective function:

$$\sum_k (\text{Area of each independent or overlapped area}) \times (\text{Cell density in the independent or overlapped area})^2.$$

Accordingly, the uniformity of the cell density in the cell density evaluation portion 14 will be described based on the objective function hereinafter.

The objective function for the uniformization of the cell density can be changed into the following formula by using the variables defined above:

$$\sum_{p \in P} a_p \times u_p^2,$$

where P is a set of the overlapped areas and the independent areas.

Next, the manner for obtaining the evaluation value for the uniformity of the cell density will be explained.

FIGS. 12A and 12B show examples of methods for obtaining evaluation values of the uniformity of the cell density. A state of the estimated distribution of cells is obtained based on input data as shown in FIG. 12A, then the respective cell density of the overlapped area b and independent area a, and c so as to obtain the evaluation value of the uniformity of the cell density.

FIG. 12A shows an example when the cell density in the respective areas are not uniform, and FIG. 12B shows an example when these are uniform.

To obtain the cell density in each of the overlapped area, it is necessary to obtain the estimated distribution of cells in the area. To obtain the estimated distribution of cells when the position and the sum total of areas of cells assigned to the arrangeable area and the shape of the area are given, the distribution $f_{np}$ of cells is minimized based on the formula:

$$\sum_{p \in P} a_p \times u_p^2,$$

where P is a set of the overlapped area and the independent areas, when $c_n$, $a_n$, $a_p$ are given. Thereafter, the cell density of the overlapped area is obtained by using the estimated distribution $f_{np}$ and the following formula:

$$u_p = \sum_{n \in N} f_{np}/a_p,$$

where N is a set of the arrangeable areas.

Figure 8:
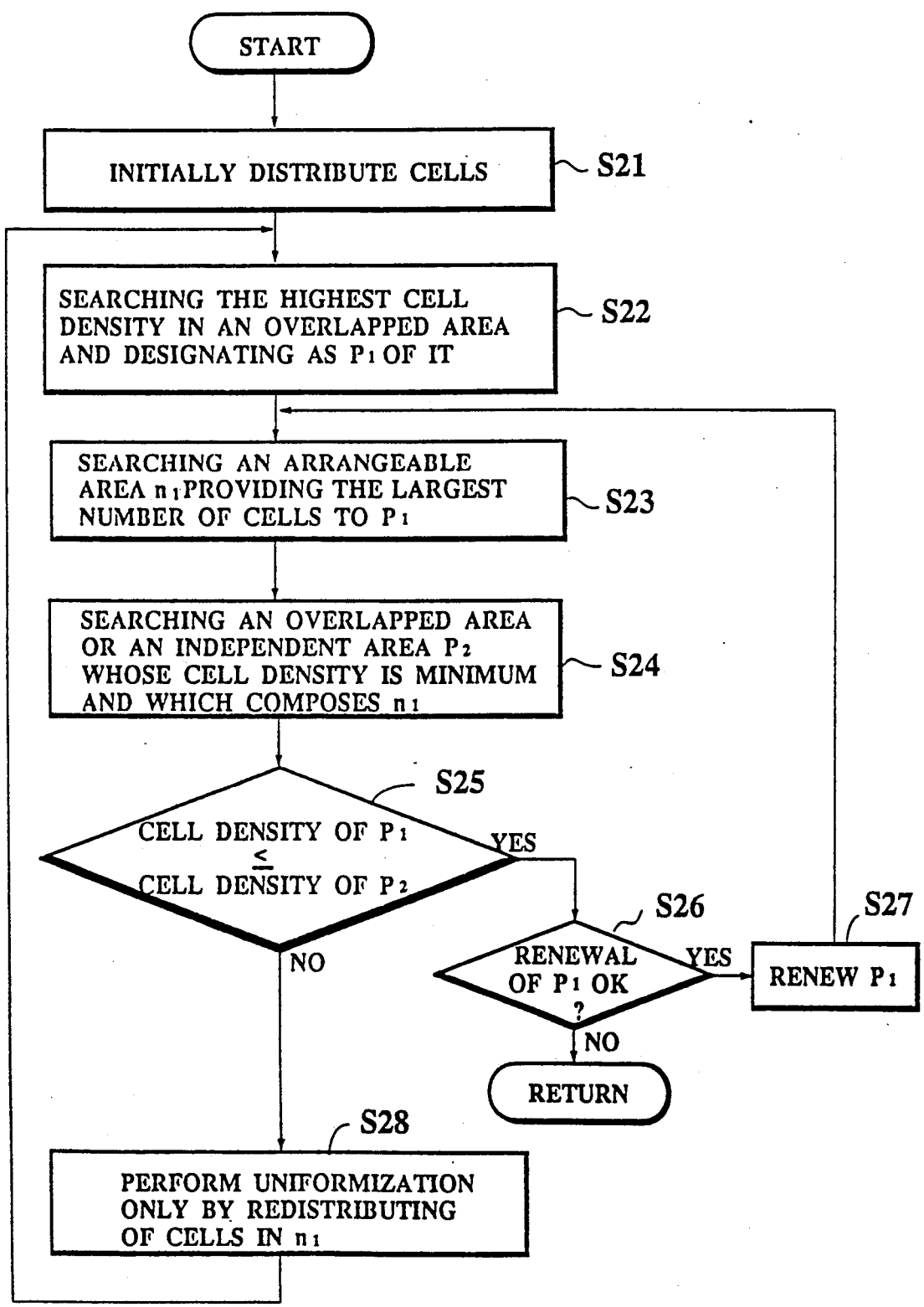
FIG. 8 is a flow chart to show a process for obtaining cell density in overlapped areas and independent areas by the automatic floorplan apparatus of the embodiment shown in FIG. 6.

According, processes as shown in FIG. 8 are repeated to make the cell density uniform. In the same drawing, cells are distributed in the overlapped areas and the independent areas initially (Step S21).

In this case, the $f_{np}$ is expressed as follows:

$$f_{np} = a_p \times c_n/a_n.$$

The step S21 is required only for initialization of the cell density obtained by the step S13 in the process of the automatic floorplan apparatus in FIG. 7. This step S21 is not necessary where the cell density is recalculated by shifting and transforming arrangeable areas cells as shown in steps S14 and S15. In such a case, the process can be started from a step S22.

In the step S22, the highest cell density is searched in the overlapped areas and the independent areas. An area having the highest cell density is designated as p1.

Next, an arrangeable area n1 to which most cells in p1 belong is searched. Subsequently, the lowest cell density is searched in the overlapped areas and the independent areas which respectively compose the arrangeable area n1. An area having the lowest cell density is designated as p2 (Step S23, S24). Then, a condition expressed by the following formula is examined:

(cell density of p1: $u1$) ≦ (cell density of p2: $u2$).

When the condition is established, an area having a secondly highest cell density is designated as p1 anew.

Namely, the process is returned to the step S23 after the renewal of p1. Then, a series of steps S23 to S25 are repeated until an overlapped area or an independent area having a lower cell density than that of p1 is not found. After the completion of the repetition, the series of the process is ended (Steps S25 to S27).

In the step S28, the following condition:

(cell density of p1: $u1$) > (cell density of p2: $u2$), is established.

While, an operational variable δ is defined as follows:

$$\delta = 1/(a_{p1} + a_{a2}) \times S_{p1p2},$$

where $S_{p1p2}$ is the total sum of all the cells in the overlapped area p2 or the independent area p1.

δ is an average of the cell density in the areas p1 and p2. Using δ, cells in p1 belonging to n1 are shifted as much as possible to make the cell density maximum uniform.

Thereafter, the cell distribution is renewed based on the following formulas:

$$f_{n1p1} = max\ \{a_{p1} \times \delta - \overline{Sn1p1}/,\ 0\}$$

$$f_{n1p2} = min\ \{a_{p2} \times \delta - \overline{Sn1p2}/,\ f_{n1p1} + f_{n1p2}\},$$

where $\overline{Sn1p1}$ is the total sum of cell areas in p1 belonging to arrangeable areas other than n1, and $\overline{Sn1p2}$ is the total sum of cell areas in p2 belonging to arrangeable areas other than n1.

After the operation, a flow of the process is returned to the step S22.

As a result, a cell density is provided from the cell distribution obtained as described above. This cell distribution and the cell density have the following characteristics.

This means that cells belonging to the same arrangeable area are in sections of the same cell density, and cells are not redistributed to an area whose cell density is higher than that of the area where the cells are originally located.

Next, a process for correcting the arrangeable areas by shifting and transforming them for the uniformity of the cell density.

The shift can be carried out in accordance with a Force Directed Method (FDM; based on a dynamic technique), and so can the transformation. As stated above, FIG. 9 shows a flow chart of a procedure for shifting arrangeable areas by the FDM. Similarly, FIG. 10 shows a flow chart for transforming arrangeable areas by the FDM. In the shifting procedure by the FDM shown in FIG. 9, an arrangeable area to be shifted and the shifting direction are determined. In the determination process, the FDM is used (Step S31).

In the FDM, a value obtained by reversing the positive and negative of the changing rate of the evaluation value in the uniformity of the cell density when respective arrangeable areas are shifted minutely is called the force of the cell density uniformity. The evaluation value is correctly lessened as compared to the original value by shifting the arrangeable areas in the direction of the force.

In the FDM, force of minimization of the wiring length is defined similarly.

First, an arrangeable area having a maximum value of the sum of the force of the cell density uniformity and the force of the wiring length minimization is selected as an object to be shifted so as to carry out the wiring length minimization and the cell density uniformity.

Subsequently, a shift amount of the arrangeable area is obtained by an unidimensional search method in a step S32.

Then, the resultant arrangeable area determined in the step S32, data for the area concerning new co-ordinates and the like are updated in a step S33.

Next, a definition method for the force of the cell density uniformity to be provided to the respective arrangeable areas will be described. Moreover, the cell density uniformity to be carried out by the FDM based on the force will be explained.

First, the change of the cell density uniformity when a side of an arrangeable area is shifted outward is examined.

Figure 13A:
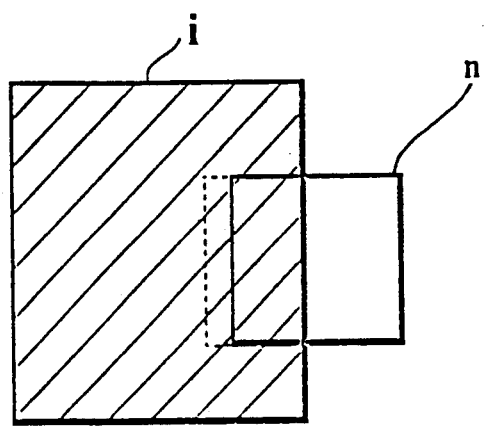
FIGS. 13A and 13B are diagrams to explain the redistribution of cells when the left side of arrangeable area shifts minutely.

In FIG. 13A, a cell density in an arrangeable area i which is in contact with the left side of an arrangeable area n is larger or equal as compared to that in the area n. At the time, since cells in the lower cell density overlapped or independent areas cannot shift high cell density, the size in the areas n cannot be changed.

Namely, the objective value of the cell density uniformity is not changed by the shift of the area n in the left direction.

Figure 13B:
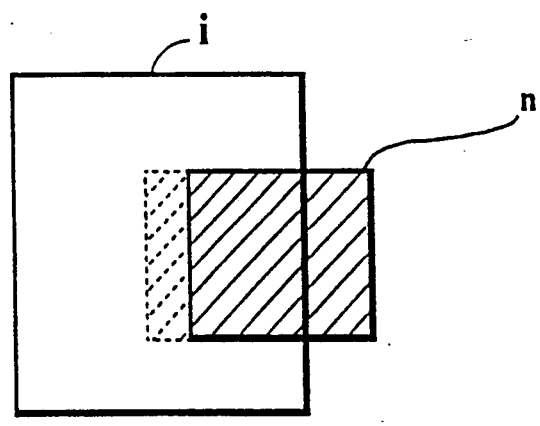

While, in FIG. 13B, a cell density in an arrangeable area i which is in contact with the left side of an arrangeable area n is smaller than that in the area n. In this case, an area $a_n$ usable for cells in the area n, and an area $a_i$ in the area i are changed in the following manners:

$$a_n \rightarrow a_n + \Delta x \cdot y,$$

$$a_i \rightarrow a_i - \Delta x \cdot y,$$

where $\Delta x$ is a shift amount, and y is a length of the left side of the area n.

Accordingly, the cell density $u_n$ in the area n and the cell density $u_i$ in the area i are changed as follows:

$$u_n \rightarrow (u_n \times a_n) / (a_n + \Delta x \cdot y),$$

$$u_i \rightarrow (u_i \times a_n) / (a_i - \Delta x \cdot y).$$

As a result, the variation of the evaluation value of the cell density uniformity is expressed by the following equation:

$$\Delta H = (u_n \times a_n)^2/(a_n + \Delta x \cdot y) \times (a_n + \Delta x \cdot y) +$$
$$(u_i \times a_i)^2/(a_i - \Delta x \cdot y) \times (a_i - \Delta x \cdot y) -$$
$$u_n^2 \times a_n - u_i^2 \times a_i \approx \Delta x \cdot y \times (u_i^2 - u_n^2).$$

Figure 14:
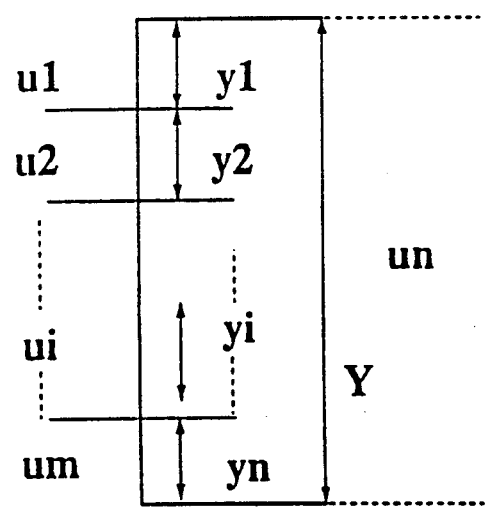
FIG. 14 is a diagram to explain the way to obtain the force for uniformity of the cell density of the arrangeable areas.

When areas overlapped to the arrangeable area n have cell densities u1, u2, ..., um respectively, and lengths left side of the area n respectively in contact with the overlapped areas are y1, y2, ..., ym as shown in FIG. 14, the variation of the evaluation value caused by the shift left side by $\Delta x$ is expressed by the following equation:

$$\Delta H = \sum_{i=1}^{n} \Delta x \cdot y_i \times (\min(u_i^2, u_n^2) - u_n^2).$$

Therefore, when each of the side of the area n is moved by $\Delta dL$, $\Delta dR$, $\Delta dB$, and $\Delta dT$, the variation of the evaluation value is obtained as the sum of the variation of that for each of the side. Namely, the total variation can be expressed by the following equation:

$$\Delta H = \sum_{E \in \{L,R,T,B\}} \sum_{\text{pieces of each side}} \Delta dE \times l_{Ei} \times (\min(u_{Ei}^2, u_n^2) - u_n^2).$$

Next, the direction in which the cell density is to be changed based on the FDM will be explained.

The arrangeable area shift $\Delta x$ in the x direction and $\Delta y$ in the y direction mean such a shift that the following equations are established at the same time:

$$\Delta dR = -\Delta dL = \Delta x, \quad \Delta dT = -\Delta dB = \Delta y.$$

Since $\Delta x$ and $\Delta y$ are independent of each other, the forces given in the direction x, y are expressed as follows respectively:

$$\text{force of the } x \text{ direction} = -\left.\frac{\partial H}{\partial x}\right|_{\Delta y=0}$$

$$= \lim_{\Delta x \to 0} -\frac{\Delta H}{\Delta x}$$

$$= \sum_{\text{pieces of right side}} l_{Li} \times \min(u_{Li}^2, u_n^2) - u_n^2) - \sum_{\text{pieces of left side}} l_{Ri} \times$$
$$\min(u_{Ri}^2, u_n^2) - u_n^2)$$

as the same procedure, $$\text{force of the } y \text{ direction} = -\left.\frac{\partial H}{\partial y}\right|_{\Delta x=0}$$

$$= \lim_{\Delta y \to 0} -\frac{\Delta H}{\Delta y}$$

$$= \sum_{\text{pieces of lower side}} l_{Bi} \times$$
$$\min(u_{Bi}^2, u_n^2) - \sum_{\text{pieces of upper side}} l_{Ti} \times \min(u_{Ti}^2, u_n^2).$$

Since the force to be provided for the respective arrangeable areas is obtained in accordance with the above equations, the areas are respectively shifted in the direction of the force in the parentheses in the order of increased value of the force. Thereby, the uniformity of the cell density can be carried out.

The FDM is advantageous in that the direction of the force to be provided for the shift of the arrangeable areas for making the cell density uniform is also the direction of the force to be provided for the shift of the area for minimizing the wiring length. Namely, the arrangeable areas can be shifted to improve the wiring length minimization and the cell density uniformity at the same time.

Moreover, the transformation of the arrangeable areas can be carried out in the same manner as the shift thereof by the FDM. As described above. FIG. 10 shows a flow chart of a transformation process by the FDM. In the transformation process shown in this diagram, an arrangeable area to be transformed and a direction of the transformation are determined. The FDM is also used in the process (Step S34).

In the FDM, the changing rate, reversed in the positive and negative, of the evaluation value of the uniformity of the cell density when each arrangeable area is transformed minutely is called the force for the uniformity of the cell density. The evaluation value can be lessened by transforming each arrangeable area in the direction of the force.

Subsequently, a transformation amount of the arrangeable area is searched by an unidimensional search method in a step S35. Then, data such as positional coordinates of the arrangeable area are renewed in the step S36.

Next, the process for making the cell density uniform by a minute transformation of the arrangeable area shown in the step S15 in FIG. 7 will be described.

Also in case the arrangeable area is transformed symmetrically in the longitudinal and the transverse direction thereof, the changing rate of the evaluation value of the cell density can be considered in the same manner as described in the case of the shifting of the arrangeable area. The minute change $\Delta x, \Delta y$ in the respective directions x, y caused by the minute transformation are expressed as follows:

$$\Delta dR = \Delta dL = \Delta x/2, \Delta dT = \Delta dB = \Delta y/2,$$

When the arrangeable area is transformed outward by $\Delta x, \Delta y$, since an area thereof is constant, the following equation is established:

$$(X+\Delta x)\cdot(Y+\Delta y) - X\cdot Y = \Delta x\cdot Y + \Delta y\cdot X + \Delta x\cdot \Delta y = 0.$$

Assuming that the term $\Delta x \cdot \Delta y$ is nearly equal to 0, an equation:

$$\Delta x \cdot Y = -\Delta y \cdot X$$

is established.

Accordingly, the changing rate $\Delta H$ of the evaluation value of the cell density when the arrangeable area is transformed outwardly in the longitudinal and the transverse direction can be expressed by the following equation using the above relation:

$$\Delta H = \sum_{E \in \{L,R,T,B\}} \sum_{\text{pieces of each side}} \Delta dE \times l_{Ei} \times$$

$$(\min(u_{Ei}^2, u_n^2) - u_n^2)$$

$$= \sum_{E \in \{L,R\}} \sum_{\text{pieces of each side}} \Delta x/2 \times l_{Ei} \times \min(u_{Ei}^2, u_n^2) +$$

$$\sum_{E \in \{B,T\}} \sum_{\text{pieces of each side}} \Delta y/2 \times l_{Ei} \times \min(u_{Ei}^2, u_n^2) -$$

$$\Delta x \cdot Y u_n^2 - \Delta y \cdot X u_n^2$$

$$= \sum_{E \in \{L,R\}} \sum_{\text{pieces of each side}} \Delta x/2 \times l_{Ei} \times \min(u_{Ei}^2, u_n^2) +$$

$$\sum_{E \in \{B,T\}} \sum_{\text{pieces of each side}} -Y \cdot \Delta x/X \cdot 2l_{Ei} \times \min(u_{Ei}^2, u_n^2).$$

The force to be provided for the transformation of the arrangeable area can be expressed as follows using the changing rate $\Delta H$:

$$\text{The force of changeing} = -\left.\frac{\partial H}{\partial Z}\right|_{XY=\text{constant}}$$

$$= \lim_{\Delta Z \to 0} -\frac{\Delta H}{\Delta Z}$$

$$= \frac{1}{2}\Bigg\{ -$$

$$\sum_{E \in \{L,R\}} \sum_{\text{pieces of each side}} X/l_{Ei} \times \min(u_{Ei}^2, u_n^2) \Bigg) +$$

$$\sum_{E \in \{B,T\}} \sum_{\text{pieces of each side}} Y \times l_{Ei} \times \min(u_{Ei}^2, u_n^2) \Bigg\}.$$

Namely, the difference between the transformation force for expansion in the direction of x and the force for shrinkage in the direction of y can be obtained by the subtraction of the average of force provided to the area in the transfer direction from the average of force provided to that in the longitudinal direction. Since the dynamic technique is advantageous in that the FDM can be used not as a post-process, but as a method for making the cell density uniform at the same time as the technique used for the shifting.

Accordingly, the wiring length minimization and the cell density uniformity can be attained with ease.

Incidentally, in the above embodiment, the operation for the cell density uniformity by the minute transformation of the arrangeable area and the operation for the cell density uniformity by the minute shifting thereof can be repeated alternately when required.

However, the operation may be carried out only by the shifting or the transformation.

Various modifications will become possible for those skilled in the art after reviewing the teachings of the present disclosure without departing from the scope thereof.

What is claimed is:

1. A method of automatic floorplan operation for generating a suitable layout of cells, comprising:
   inputting a plurality of cell groups having a logical hierarchy structure, each cell group of said cell groups including a plurality of cells arrangeable on a plurality of cell arrangeable areas permitting overlapped areas and independent areas;
   determining estimated distributions of said cell groups in said overlapped areas and said independent areas in said cell arrangeable areas;
   operating on cell densities of said cell groups whose estimated distributions in said overlapped areas and said independent areas are determined at said determining step;
   evaluating respective degrees of uniformity of cell density in said overlapped areas and said independent areas obtained by said operating step;
   repeatedly correcting areas and positions of said cell arrangeable areas when said uniformity of cell density is estimated to be insufficient by said evaluating step; and
   outputting a layout of cells when said uniformity of cell density is estimated to be sufficient by said evaluating step.

2. An automatic floorplan operation apparatus for generating a suitable layout of cells, comprising:
   input means for inputting a plurality of cell groups having a logical hierarchy structure, each cell group of said cell groups including a plurality of cells arrangeable on a plurality of cell arrangeable areas permitting overlapped areas and independent areas;
   estimated distribution determination means for determining estimated distributions of said cell groups in said overlapped areas and said independent areas in said cell arrangeable areas;
   cell density operation means for operating on cell densities of said cell groups whose estimated distributions in said overlapped areas and said independent areas are determined by said estimated distribution determination means;
   cell density evaluation means for evaluating respective degrees of uniformity of cell density in said overlapped areas and said independent areas obtained by said cell density operation means;

area definition correction means for repeatedly correcting areas and positions of cell arrangeable areas when uniformity of cell density is estimated to be insufficient by said cell density evaluation means; and output means for outputting a layout of said cells when said uniformity of cell density is estimated to be sufficient by said cell density evaluation means.

3. An automatic floor plan operation apparatus according to claim 2, wherein said area definition correction means minutely shifts said cell arrangeable areas in directions for making uniform said cell densities of respective cell arrangeable areas and sets new arrangeable areas by a force directed method (FDM) based on results of evaluations about said cell densities obtained by said cell density evaluation means.

4. An automated floor plan operation apparatus according to claim 3, wherein said area definition correction means uses a unidimensional search method as said FDM to shift minutely said respective arrangeable areas in directions for making uniform said cell densities of respective cell arrangeable areas, and sets new cell arrangeable areas by using said FDM based on said results of evaluations about said cell densities obtained by said cell density evaluation means.

5. An automatic floor plan operation apparatus according to claim 2, wherein said area definition correction means minutely transforms said cell arrangeable areas in directions for making uniform said cell densities of respective cell arrangeable areas and sets new cell arrangeable areas by using a dynamic technique method based on results of evaluations about said cell densities obtained by said cell density evaluation means.

6. An automatic floorplan operation apparatus according to claim 2, wherein said area definition correction means sets new cell arrangeable areas by alternately repeating an area definition operation for setting new positional relations of respective cell arrangeable areas by minutely shifting said areas in directions for making uniform said cell densities by using a dynamic technique force directed method (FDM) based on results from evaluations of cell density obtained by said cell density evaluation means, and another area definition operation for setting new positional relations of respective cell arrangeable areas by minutely transforming said areas in directions for making uniform said cell densities by using a dynamic technique based on results from evaluation of cell densities obtained by said cell density evaluation means.

* * * * *